(12) United States Patent
You et al.

(10) Patent No.: US 12,087,617 B2
(45) Date of Patent: Sep. 10, 2024

(54) FORMATION METHOD FOR AIR SPACER LAYER AND SEMICONDUCTOR STRUCTURE

(71) Applicant: CHANGXIN MEMORY TECHNOLOGIES, INC., Hefei (CN)

(72) Inventors: Kang You, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/487,854

(22) Filed: Sep. 28, 2021

(65) Prior Publication Data

US 2022/0020632 A1    Jan. 20, 2022

Related U.S. Application Data

(63) Continuation of application No. PCT/CN2021/095030, filed on May 21, 2021.

(30) Foreign Application Priority Data

Jun. 5, 2020   (CN) .......................... 202010505511.4

(51) Int. Cl.
   *H01L 21/764*      (2006.01)
   *G11C 5/06*        (2006.01)
   (Continued)

(52) U.S. Cl.
   CPC ...... *H01L 21/764* (2013.01); *H01L 21/76224* (2013.01); *H01L 21/7682* (2013.01);
   (Continued)

(58) Field of Classification Search
   CPC .............. H01L 21/764; H01L 21/7682; H01L 21/76224; H01L 21/76837; H01L 23/5283;
   (Continued)

(56) References Cited

U.S. PATENT DOCUMENTS

| 8,828,829 B2 | 9/2014 | Joung et al. |
| 9,905,643 B1* | 2/2018 | Bergendahl ..... H01L 21/823481 |
| 2014/0179102 A1* | 6/2014 | Joung ................ H10B 12/0335 |
| | | 438/666 |

(Continued)

FOREIGN PATENT DOCUMENTS

| CN | 102543944 A | 7/2012 |
| CN | 109994418 A | 7/2019 |

(Continued)

OTHER PUBLICATIONS

First Office Action cited in CN202010505511.4, mailed Apr. 21, 2022, 14 pages.

(Continued)

*Primary Examiner* — John P. Dulka
(74) *Attorney, Agent, or Firm* — Syncoda LLC; Feng Ma

(57) ABSTRACT

The present application relates to a formation method for an air spacer layer and a semiconductor structure. The formation method for an air spacer layer includes: forming a first structure on a substrate and forming a second structure on the substrate, the second structure being located on a side surface of the first structure, a first trench being formed between the second structure and the first structure, and the second structure being exposed in the first trench; and growing, by an epitaxial growth process, an epitaxial layer on the second structure exposed in the first trench, the epitaxial layer not filling up the first trench, and an unfilled portion of the first trench forming the air spacer layer.

16 Claims, 11 Drawing Sheets

(51) Int. Cl.
  *H01L 21/762* (2006.01)
  *H01L 21/768* (2006.01)
  *H01L 23/528* (2006.01)
  *H10B 12/00* (2023.01)

(52) U.S. Cl.
  CPC .... *H01L 21/76837* (2013.01); *H01L 23/5283* (2013.01); *H10B 12/315* (2023.02); *H10B 12/482* (2023.02); *H10B 12/488* (2023.02); *G11C 5/063* (2013.01)

(58) Field of Classification Search
  CPC ...... H01L 2221/1063; H01L 21/76831; H10B 12/315; H10B 12/482; H10B 12/488; H10B 12/0335; H10B 12/30; G11C 5/063
  See application file for complete search history.

(56) References Cited

U.S. PATENT DOCUMENTS

| | | |
|---|---|---|
| 2015/0014759 A1 | 1/2015 | Lee et al. |
| 2016/0225876 A1* | 8/2016 | Nam ................ H01L 21/32139 |
| 2019/0229184 A1 | 7/2019 | Shank et al. |

FOREIGN PATENT DOCUMENTS

| | | |
|---|---|---|
| JP | 2004335833 A | 11/2004 |
| TW | 200843038 A | 11/2008 |

OTHER PUBLICATIONS

International Search Report as cited in PCT Application No. PCT/CN2021/095030 mailed Aug. 12, 2021, 9 pages.

* cited by examiner

FORMATION METHOD FOR AIR SPACER LAYER AND SEMICONDUCTOR STRUCTURE

CROSS-REFERENCE TO RELATED APPLICATIONS

This application is a continuation application of International Patent Application No. PCT/CN2021/095030, which claims priority to Chinese Patent Application No. 202010505511.4, filed with the Chinese Patent Office on Jun. 5, 2020 and entitled "FORMATION METHOD FOR AIR SPACER LAYER AND SEMICONDUCTOR STRUCTURE". International Patent Application No. PCT/CN2021/095030 and Chinese Patent Application No. 202010505511.4 are incorporated herein by reference in their entireties.

TECHNICAL FIELD

The present application relates to the field of semiconductors, and in particular, to a formation method for an air spacer layer and a semiconductor structure.

BACKGROUND

With the increase in integration of semiconductor devices, internal structure dimensions of the semiconductor devices are gradually reduced and distribution density is gradually increased. However, the larger the structure distribution density, the smaller the spacing between structures, and the more likely to cause electric breakdown of a medium or formation of parasitic capacitance for conductive structures. Therefore, how to effectively electrically isolate adjacent conductive structures has become a focus of a semiconductor device fabrication process.

Currently, an air spacer layer is generally formed on each of two sides of a conductive structure to reduce parasitic capacitance between adjacent structures and improve an electrical isolation effect between the adjacent structures. In a specific semiconductor device fabrication process, a sacrificial layer is generally formed on a side surface of the conductive structure, and then polysilicon is formed. Due to a requirement for a narrow width of the air spacer layer, the corresponding sacrificial layer has a narrow width generally no more than 5 nm, it is difficult to completely remove the sacrificial layer by etching during an actual fabrication process, and an etching agent does not etch the sacrificial layer uniformly, resulting in an uneven surface of the air spacer layer formed, which reduces an electrical isolation effect of the air spacer layer and affects electrical performance of semiconductor devices.

SUMMARY

The present application provides another formation method for forming a spacer layer and a semiconductor structure.

A formation method for an air spacer layer, including:

forming a plurality of parallel spaced first structures on a substrate;

forming a second structure on the substrate, the second structure being located between adjacent first structures, and a first trench being formed between the second structure and the first structure; and growing an epitaxial layer on a surface of the second structure by an epitaxial growth process, and filling part of the first trench with the epitaxial layer, an unfilled portion of the first trench forming the air spacer layer.

A semiconductor structure, including:

a substrate;

a plurality of first structures spaced on the substrate in parallel;

a second structure formed on the substrate and located between adjacent first structures, a first trench being formed between the second structure and the first structure; and an epitaxial layer grown by the second structure and the substrate by epitaxial growth, the epitaxial layer being formed at a bottom of the first trench and a side surface of the second structure toward the first trench, and an unfilled portion of the first trench forming an air spacer layer.

Figure 1:
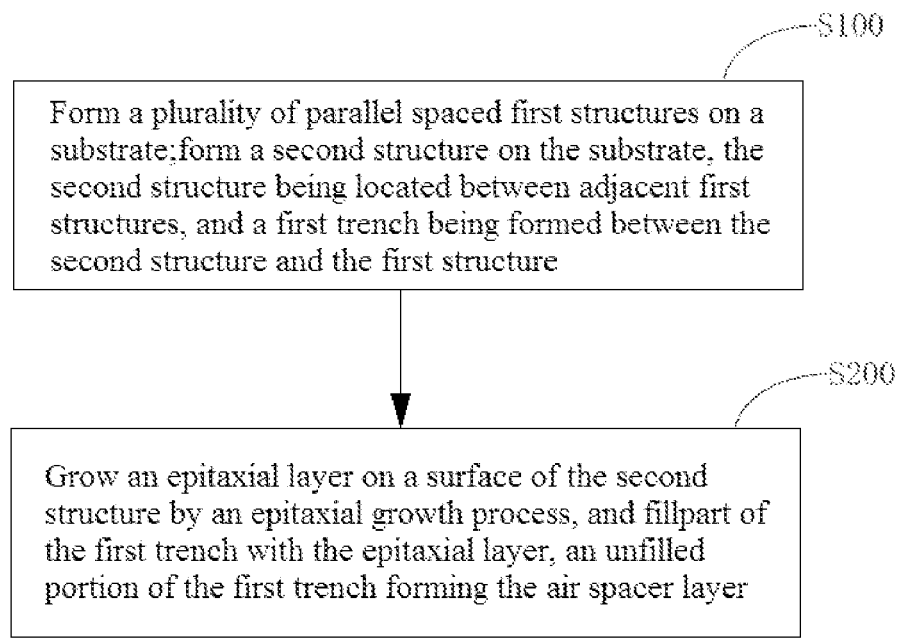
FIG. 1 is a flowchart of steps of a formation method for an air spacer layer according to an embodiment.

REFERENCE NUMERALS substrate: 100; trench isolation structure: 110; active region: 120; buried wordline: 130; wordline protection structure: 140; first structure: 200; conductive structure: 210; bitline plug: 211; bitline: 212; bitline protection structure: 220; isolation sidewall: 230; gap filling layer: 301; second structure: 300; first trench: 310; epitaxial layer: 320; air-spacer layer: 311; isolation structure: 400; first direction: X; second direction: Y.

DESCRIPTION OF EMBODIMENTS

In order to facilitate understanding of the present application, a more complete description of the present application is provided below with reference to the relevant drawings. Preferred embodiments of the present application are given in the drawings. However, the present application may be implemented in many different forms and is not limited to the embodiments described herein. Instead, these embodiments are provided to make the disclosure of the present application more thorough and complete.

Unless otherwise defined, all of the technical and scientific terms used herein have the same meanings as would generally understood by those skilled in the technical field of the present application. The terms used herein in the specification of the present application are for the purpose of describing specific embodiments only, and are not intended to limit the present application. The term "and/or" used herein includes any and all combinations of one or more related listed items.

In the conventional art, a process of forming an air spacer layer involves: first forming a to-be-isolated conductive structure, then sequentially forming an inner dielectric layer, a sacrificial layer and an outer dielectric layer outwards on a side surface of the conductive structure, then forming polysilicon in contact with the outer dielectric layer, and finally selecting an etching agent with a relatively high etch selectivity ratio to remove the sacrificial layer, to form the air spacer layer that isolates the conductive structure from polysilicon. Due to a requirement for a narrow width of the air spacer layer, the corresponding sacrificial layer has a narrow width generally no more than 5 nm, it is difficult to completely remove the sacrificial layer by etching during an actual fabrication process, and an etching agent does not etch the sacrificial layer uniformly, resulting in an uneven surface of the air spacer layer formed, which reduces an electrical isolation effect of the air spacer layer and affects electrical performance of semiconductor devices.

As shown in FIG. 1, in one embodiment of the present application, a formation method for an air spacer layer 311 includes following steps:

in step S100, a plurality of parallel spaced first structures are formed on a substrate; and a second structure is formed on the substrate. The second structure is located between adjacent first structures, and a first trench is formed between the second structure and the first structure.

Figure 8:
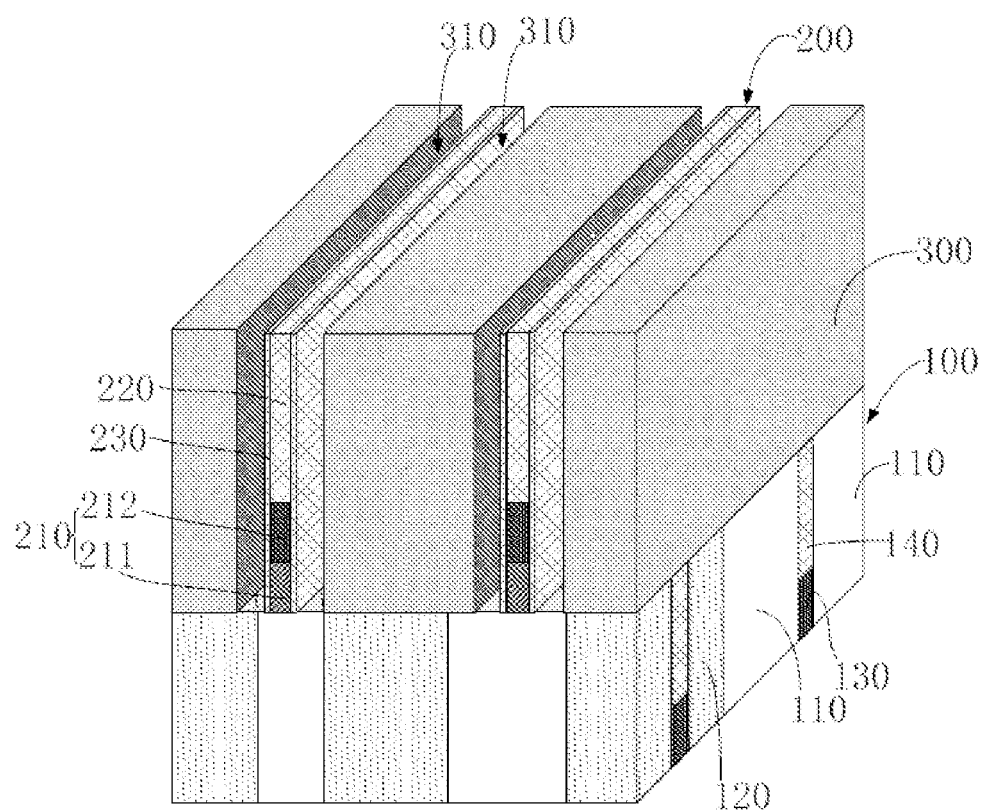
FIG. 8 is a perspective view of a structure after the second structure is etched to form the first trench according to an embodiment.

As shown in FIG. 8, a first structure 200 and a second structure 300 are formed on a substrate 100, and a first trench 310 is formed between the first structure 200 and the second structure 300. The first structure 200 and the second structure 300 are structures required to be isolated through an air spacer layer 311, and the second structure 300 is made of a material capable of epitaxial growth.

In an actual process, the first structure 200, the second structure 300 and the first trench 310 may be formed in a variety of manners. Methods of forming the first structure 200, the second structure 300 and the first trench 310 are not limited herein.

In one embodiment, the first structure 200 and the second structure 300 arranged at an interval may be formed directly at different positions of the substrate 100, and the interval between the first structure 200 and the second structure 300 is the first trench 310.

In another embodiment, step S100 includes following substeps:

in step S110, a first structure is formed on a substrate.

Figure 2:
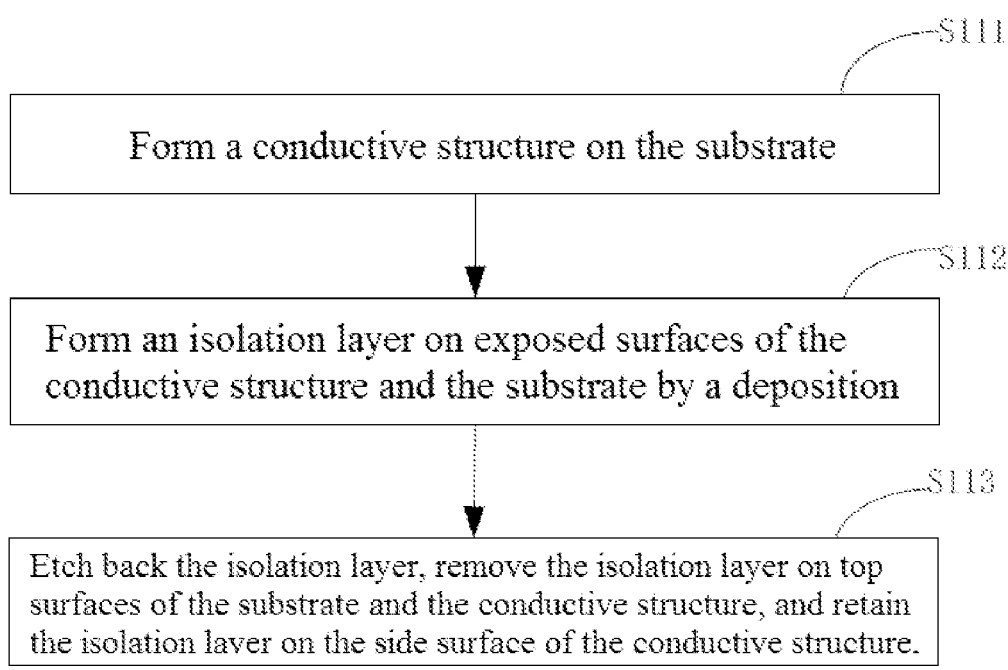
FIG. 2 is a flowchart of steps of forming a first structure according to an embodiment.
Figure 6:
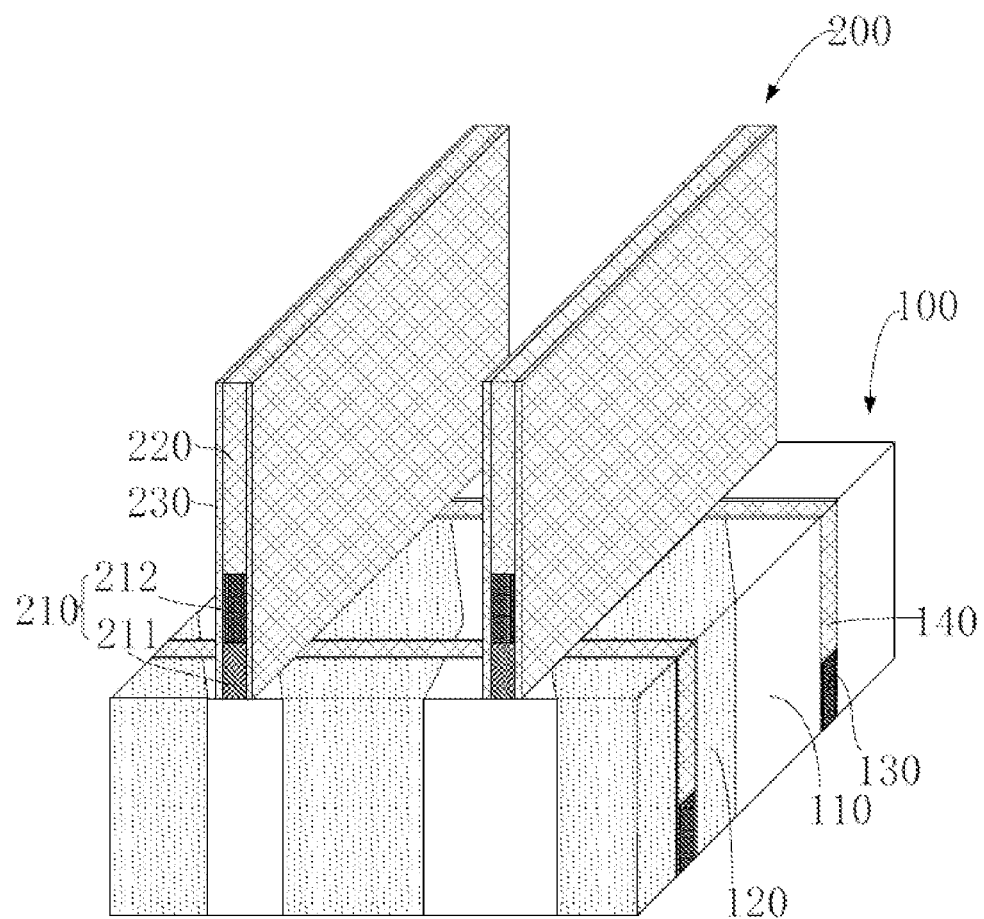
FIG. 6 is a perspective view of a structure after an isolation sidewall is formed on each of two sides of the bitline according to an embodiment.

As shown in FIG. 6, the first structure 200 is formed on the substrate 100 first. The first structure 200 may be any structure required to be isolated through the air spacer layer. In one embodiment, the first structure 200 is made of a fully exposed conductive material. In other embodiments, the first structure 200 may also include other structures. In this embodiment, the first structure 200 includes a conductive structure 210 and an isolation sidewall 230 located on each of two sides of the conductive structure 210. Specifically, as shown in FIG. 2, a process of forming the first structure 200 includes following steps:

in step S111, a conductive structure is formed on the substrate.

Figure 5:
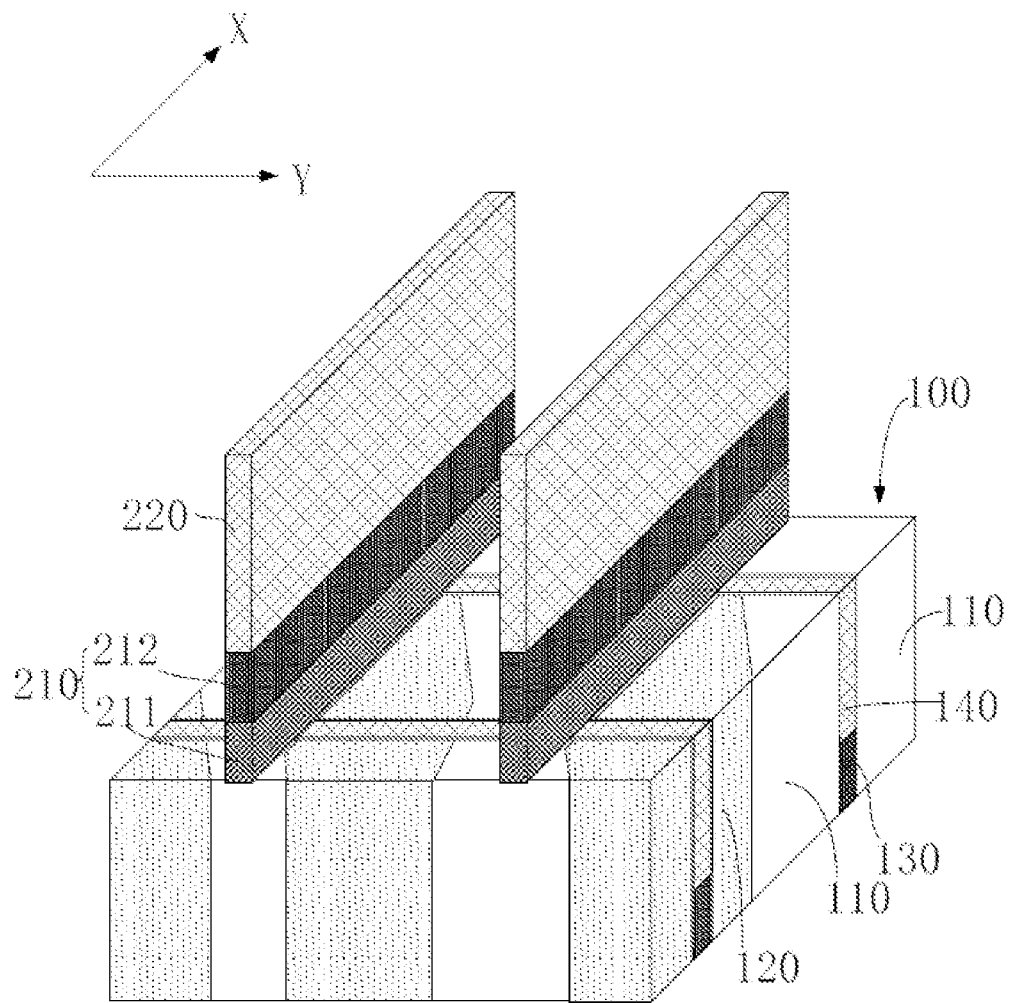
FIG. 5 is a perspective view of a structure after a bitline is formed on a substrate according to an embodiment.

As shown in FIG. 5, the conductive structure 210 is formed on the substrate 100. In one embodiment, the air spacer layer is formed during fabrication of a memory, and the conductive structure 210 includes a bitline extending along a first direction X. Further, the conductive structure 210 includes a bitline plug 211 and a bitline 212 that are superposed. The bitline plug 211 is made of polysilicon, and the bitline 212 is made of metal tungsten and may also be made of aluminum, copper, nickel, cobalt or the like. In one embodiment, a bitline protection structure 220 is further formed on the bitline 212, and the bitline protection structure 220 includes silicon nitride.

In one embodiment, the substrate 100 is a semiconductor substrate, and an upper surface layer of the substrate 100 is divided into a plurality of active regions 120 by a trench isolation structure 110. Specifically, the trench isolation structure 110 includes silicon oxide. A buried wordline 130 is further formed in the substrate 100, a top surface of the buried wordline 130 is lower that a top surface of the substrate 100, and a wordline protection structure 140 extending from the buried wordline 130 to the top surface of the substrate 100 is formed on the buried wordline 130. Specifically, the buried wordline 130 is made of metal tungsten, and the wordline protection structure 140 is made of silicon nitride, silicon oxide, silicon nitride, or the like.

In step S112: an isolation layer is formed on exposed surfaces of the conductive structure and the substrate by a deposition process.

In step S113: the isolation layer is etched back, the isolation layer on top surfaces of the substrate and the conductive structure is removed, and the isolation layer on the side surface of the conductive structure is retained, to form the isolation sidewall.

As shown in FIG. 6, firstly, a whole piece of isolation layer is deposited by a deposition process; then, the isolation layer is etched back, and the isolation layer on the side surface of the conductive structure 210 is retained to form the isolation sidewall 230. Specifically, the isolation sidewall 230 is made of silicon nitride or other dielectric materials. The deposition process includes chemical vapor deposition and atomic layer deposition. In this embodiment, atomic layer deposition is specifically used in the deposition process. For example, the conductive structure 210 includes a bitline plug 211 and a bitline 212. Firstly, an isolation layer of a same thickness is deposited on exposed surfaces of the bitline plug 211, the bitline 212, the bitline protection structure 220 and the substrate 100. In this case, the isolation layer conformally covers the exposed surfaces of the bitline plug 211, the bitline 212, the bitline protection structure 220 and the substrate 100. Then, the isolation layer is etched back vertically downwards, the isolation layer on a top surface of the bitline protection structure 220 and a top surface of the substrate 100 is removed, and the isolation layer on side surfaces of the bitline plug 211, the bitline 212 and the bitline protection structure 220 is retained, to form the isolation sidewall 230. In this case, fabrication of the first structure 200 is completed.

In step S120: a second structure is formed on the substrate, wherein the second structure is located between adjacent first structures, and a first trench is formed between the second structure and the first structure.

After the first structure 200 is formed, a second structure 300 is formed on the substrate 100. The second structure 300 is located on each of two sides of the first structure 200 and a first trench 310 is formed between the first structure 200 and the second structure 300. The second structure 300 is made of a material capable of epitaxial grown, for example, a semiconductor material such as silicon or germanium. In this embodiment, the second structure 300 is made of polysilicon.

In one embodiment, the second structure 300 arranged at an interval from the first structure 200 may be formed directly on each of two sides of the first structure 200, and the interval between the first structure 200 and the second structure 300 is the first trench 310.

Figure 3:
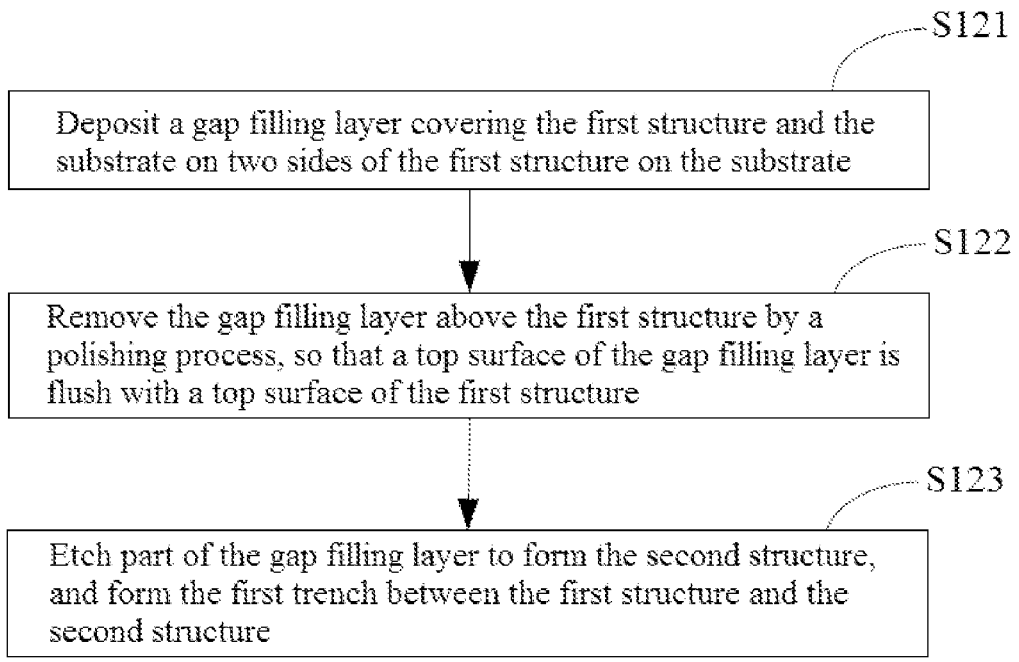
FIG. 3 is a flowchart of steps of forming a second structure according to an embodiment.

In this embodiment, as shown in FIG. 3, step S120 includes following substeps:

In step S121, a gap filling layer covering the first structure and the substrate on two sides of the first structure is deposited on the substrate.

A thick gap filling layer is deposited above the substrate 100 by a deposition process, and the gap filling layer covers the first structure 200 and the substrate 100 on two sides of the first structure 200. The deposition process may be chemical vapor deposition, physical vapor deposition, or the like.

In step S122, the gap filling layer above the first structure is removed by a polishing process, so that a top surface of the gap filling layer is flush with a top surface of the first structure.

Figure 7:
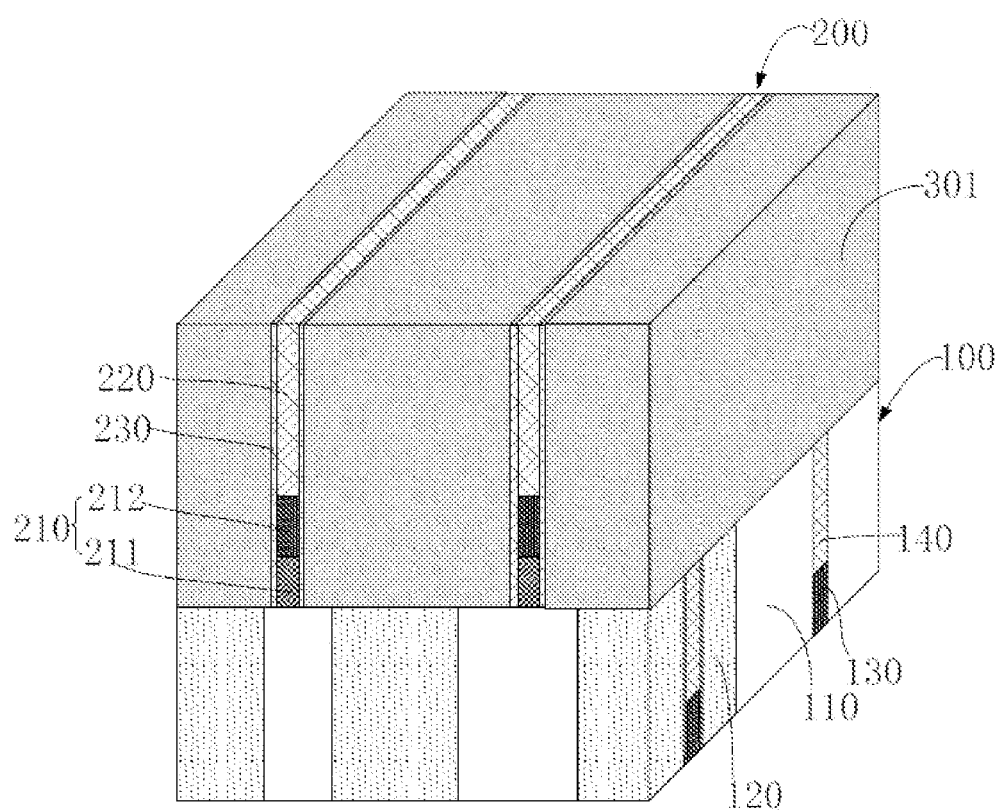
FIG. 7 is a perspective view of a structure after the second structure is deposited on the substrate according to an embodiment.

As shown in FIG. 7, a top surface of the gap filling layer 301 is polished by a polishing process to gradually reduce a height of the gap filling layer 301 and flatten the top surface of the gap filling layer 301, and the polishing stops when a top surface of the first structure 200 is exposed, for example, when the bitline protection structure 220 is exposed; in this case, the top surface of the gap filling layer 301 is flush with the top surface of the first structure 200.

In step S123: part of the gap filling layer is etched to form the second structure, and the first trench is formed between the first structure and the second structure.

As shown in FIG. 8, part of the gap filling layer on the two sides of the first structure 200 is etched to form the second structure 300, and the first trench 310 is formed between the first structure 200 and the second structure 300. Specifically, firstly, a mask layer is formed on the second structure 300, the mask layer is provided with a window exposing the second structure 300, and a position of the first trench 310 is defined through the window. Then, the second structure 300 is etched to form the first trench 310. In a specific embodiment, when the first structure 200 includes a bitline protection structure 220 and an isolation sidewall 230, the window further exposes the first structure 200. An etching agent with a relatively great etch selectivity ratio for the second structure 300 is selected for etching, and the exposed first structure 200 is not affected by the etching. Specifically, the first trench 310 has a trench width ranging from 1 nm to 20 nm. The trench width of the first trench 310 is also spacing between the first structure 200 and the second structure 300 that are on two opposite sides of the first trench 310. In this case, the steps of forming the first structure 200, the second structure 300 and the first trench 310 on the substrate 100 are completed.

In step S200: an epitaxial layer is grown, by an epitaxial growth process, from the second structure exposed in the first trench, part of the first trench is filled with the epitaxial layer, and an unfilled portion of the first trench forms the air spacer layer.

Figure 9A:
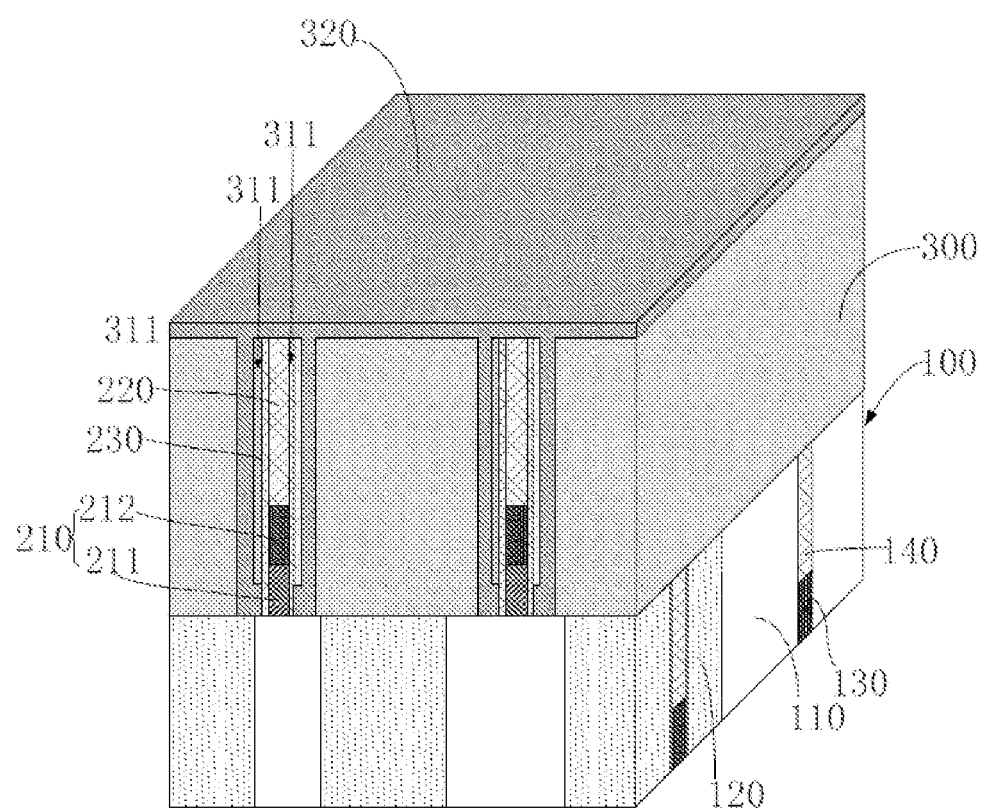
FIG. 9a is a perspective view of a structure after the air spacer layer is formed by epitaxial growth according to an embodiment.
Figure 9B:
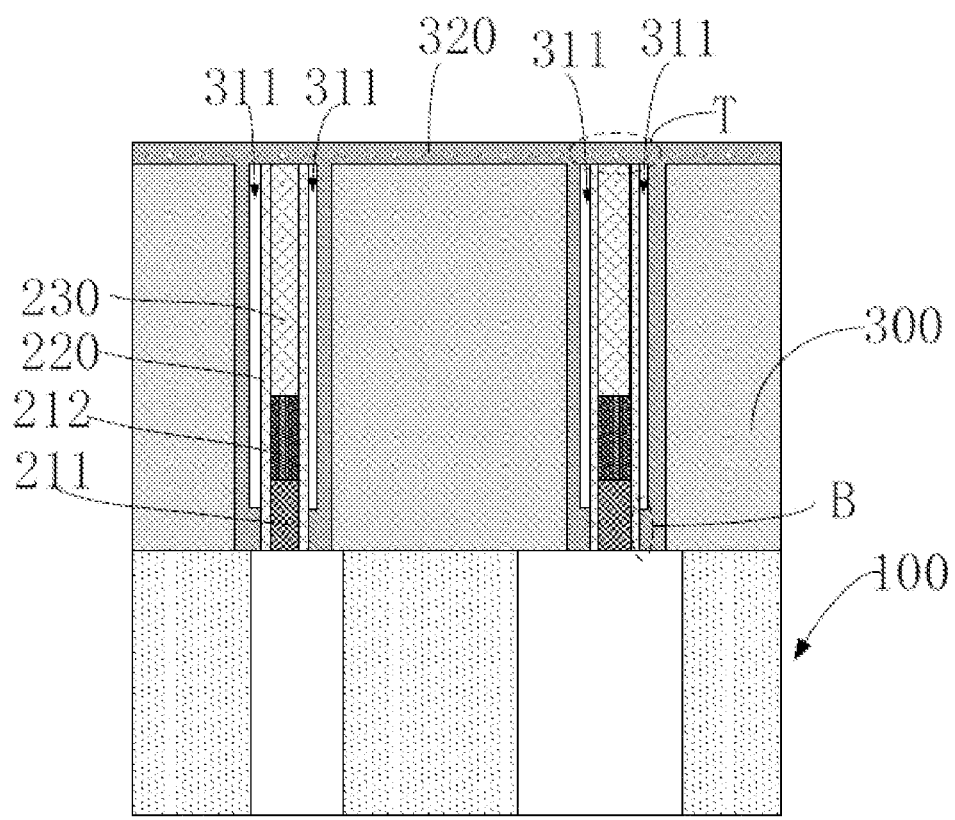
FIG. 9b is a side cross-sectional view of a structure after the air spacer layer is formed by epitaxial growth according to an embodiment.

Referring to FIG. 9a and FIG. 9b together, the structure formed in step S100 is placed in an epitaxial growth cavity, the second structure 300 undergoes epitaxial growth, a sidewall of the second structure 300 exposed in the first trench 310 begins to grow outwards and gradually fills the first trench 310, and a width of the first trench 310 gradually decreases. The time of epitaxial growth is controlled to obtain an epitaxial layer 320 with a target thickness, and the epitaxial layer 320 fills part of the first trench 310 and does not fill up the first trench 310, and the first trench 310 not filled up forms the air spacer layer. Specifically, the epitaxial layer has a thickness ranging from 1 nm to 15 nm, and the formed air spacer layer 311 may have a width ranging from 0.1 nm to 5 nm.

Figure 4:
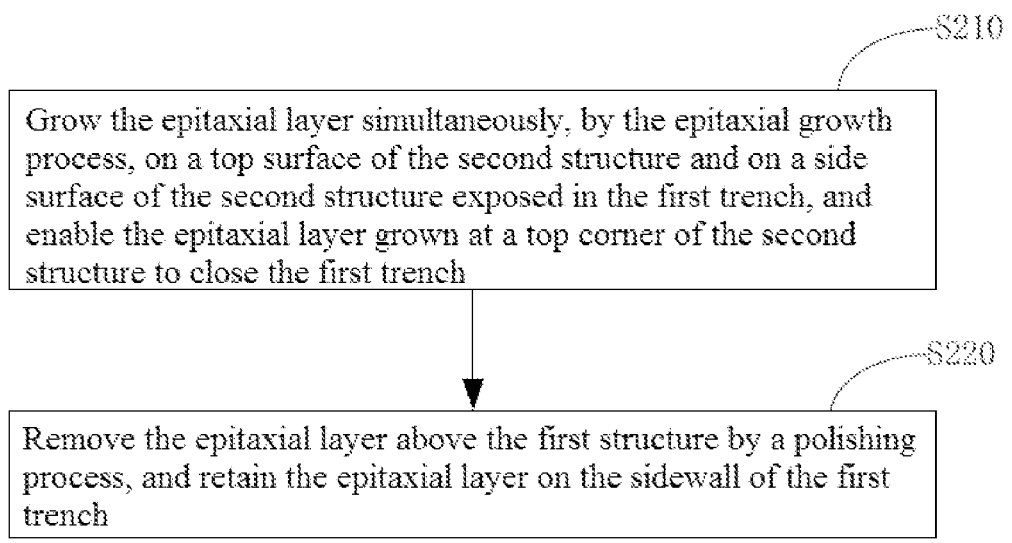
FIG. 4 is a flowchart of steps of forming an epitaxial layer on a sidewall of a first trench according to an embodiment.

In this embodiment, as shown in FIG. 4, step S200 includes following substeps:

in step S210, the epitaxial layer is grown simultaneously, by the epitaxial growth process, on a top surface of the second structure and on a side surface of the second structure exposed in the first trench, and the epitaxial layer grown at a top corner of the second structure is enabled to seal the first trench.

In an actual epitaxial growth process, exposed surfaces of the second structure 300 undergo epitaxial growth, and the epitaxial layer 320 is grown simultaneously on a top surface of the second structure 300 and on a side surface of the second structure 300 exposed in the first trench 310; in this case, the epitaxial layer at the top corner of the second structure 300 is grown at a speed higher than that of the epitaxial layer on the side surface. Therefore, before the epitaxial layer on the side surface of the first trench does not fill up the first trench 310, the epitaxial layer grown at the top corner of the second structure 300 has sealed the first trench 310. As shown in FIG. 9a, within a dashed box T, the epitaxial layer seals a top opening of the first trench 310.

In one embodiment, the substrate 100 is a semiconductor substrate. During the epitaxial growth, an active region 120 exposed at the bottom of the first trench 310 may also undergo epitaxial growth, so that the bottom of the first trench 310 is sealed by the epitaxial layer. As shown in FIG. 9b, within a dashed box B, the bottom of the first trench 310 is sealed by the epitaxial layer.

In step S220: the epitaxial layer above the first structure is removed by a polishing process, and the epitaxial layer on the sidewall of the first trench is retained.

Figure 10A:
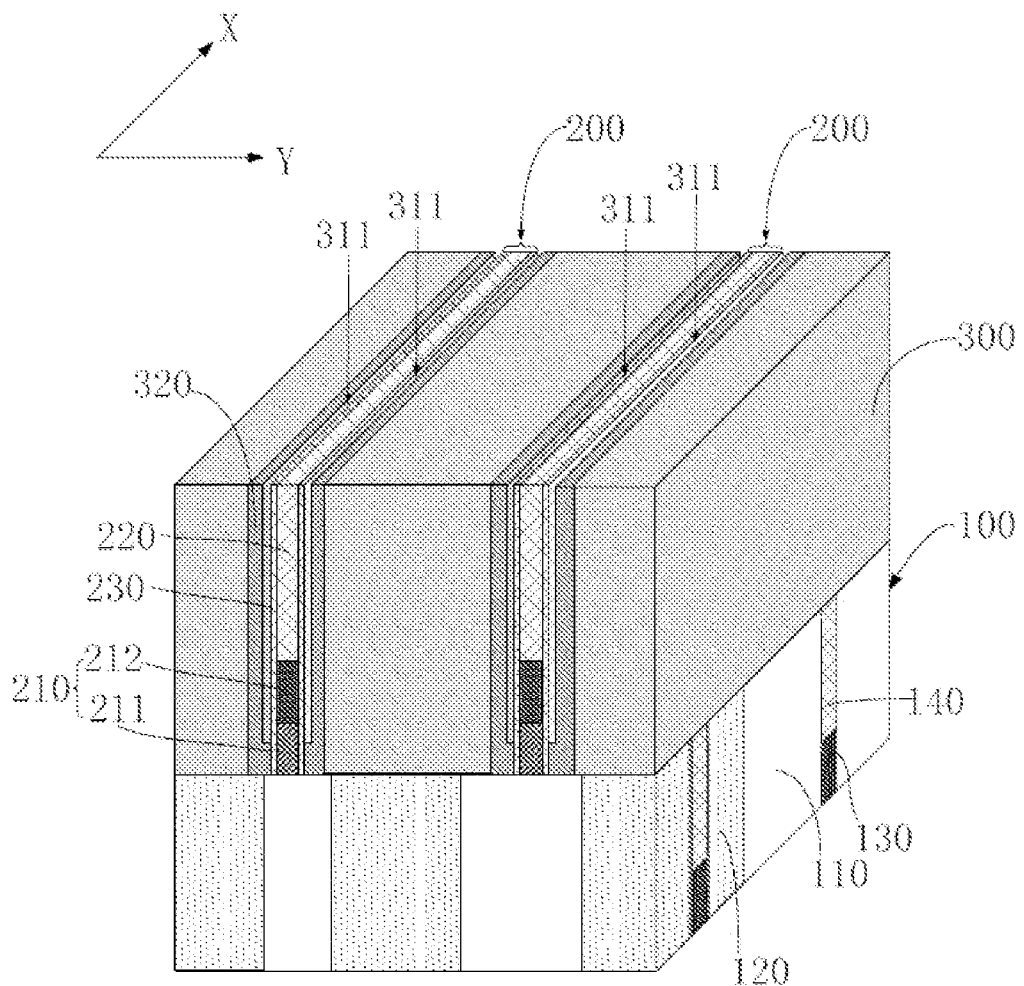
FIG. 10a is a perspective view of a structure after the epitaxial layer above the first structure is removed according to an embodiment.
Figure 10B:
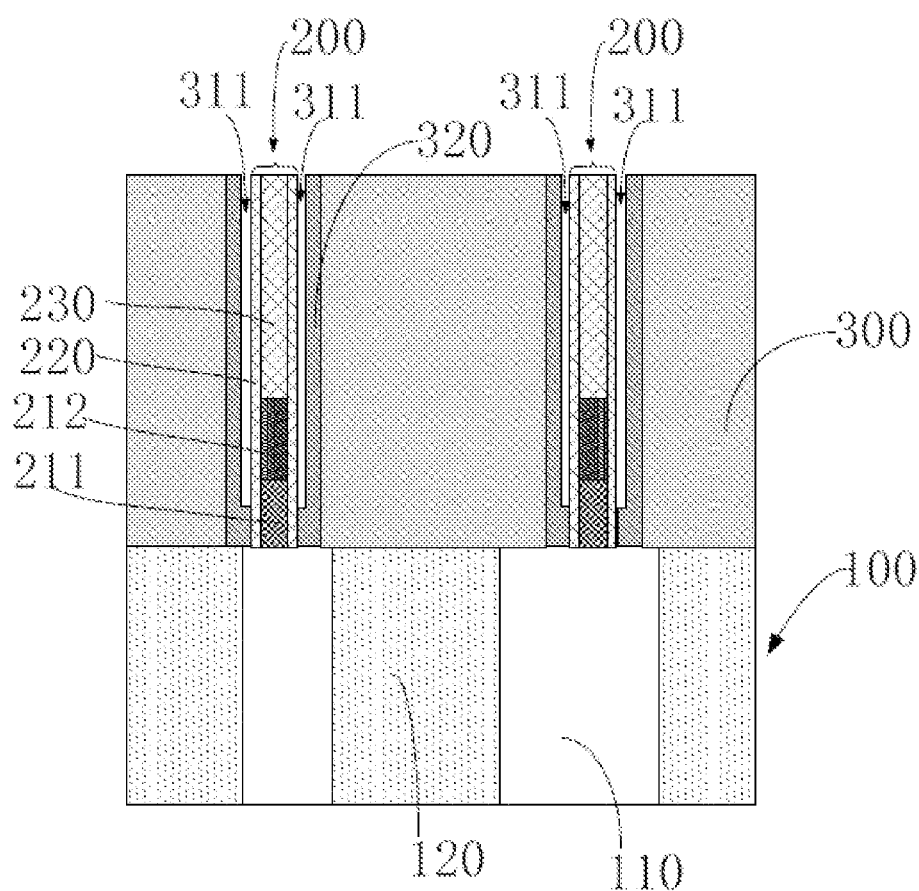
FIG. 10b is a side cross-sectional view of a structure after the epitaxial layer above the first structure is removed according to an embodiment.

As shown in FIG. 10a and FIG. 10b, when the epitaxial layer at the top corner of the second structure 300 grows fast to seal the top opening of the first trench 310, a top surface of the epitaxial layer is polished by the polishing process, the epitaxial layer grown on the top surface of the second structure 300 is removed; that is, the epitaxial layer above the first structure 200 is removed, the first structure 200 and the first trench 310 are exposed, and the epitaxial layer 320 on the sidewall of the first trench 310 is retained.

In one embodiment, the second structure 300 is made of polysilicon. Chemical vapor phase epitaxial growth is used in the epitaxial growth, and the chemical vapor phase epitaxial growth is fast and easy to control. During specific epitaxial growth process, the filled gas include $SiH_4$ (or $SiH_2CH$), $H_2$, and HCl, and epitaxial growth is performed at a temperature ranging from 600° C. to 900° C. $SiH_4$ (or $SiH_2CH$) and HCl are used as reaction gases to generate the epitaxial layer. In other embodiments, $SiCl_4$ and $H_2$ may also be used as reaction gases. In one embodiment, during the epitaxial growth process, a doping gas is added to form a doped epitaxial layer. For example, the filled gas further includes PH$_3$, which forms a P-doped epitaxial layer through epitaxial growth. In one embodiment, prior to the epitaxial growth, a step of cleaning the surface of the second structure 300 in situ is further included. By in-situ cleaning, microparticles, organic matters and metal ions on the surface of the second structure 300 are removed to ensure the quality of the later epitaxial layer.

In one embodiment, when a buried wordline 130 and a wordline protection structure 140 superposed on the buried wordline 130 are formed in the substrate 100, after step S200, following steps are further included:

in step S310, the second structure is etched to form a second trench exposing the wordline protection structure, and the second trench penetrates the second structure along the second direction.

In one embodiment, a mask layer is formed on the second structure 300, and an etching window of the second trench is defined through the mask layer. The etching window directly faces the wordline protection structure 140 therebelow. The second structure 300 is etched through the etching window to expose the wordline protection structure 140 in the substrate 100, and the second trench penetrates the second structure 300 along the second direction Y.

In step S320: an isolation structure is deposited, and the isolation structure fills the second trench and covers the second structure.

Figure 11:
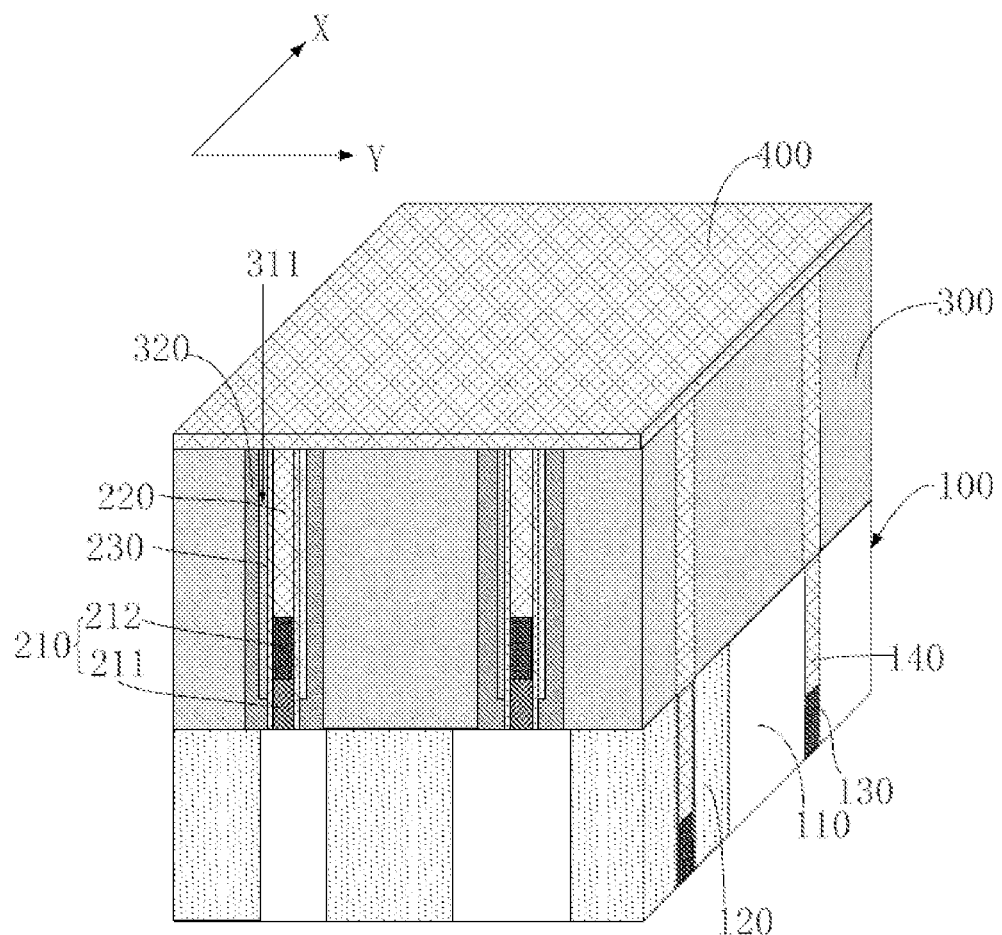
FIG. 11 is a perspective view of a structure after the second structure is provided with a second trench and an isolation structure is deposited according to an embodiment.

As shown in FIG. 11, an isolation structure 400 is deposited, and the isolation structure 400 fills the second trench and covers the second structure 300 on each of two sides of the second trench.

In one embodiment, a source region and a drain region are formed in an active region 120 on two sides of the buried wordline 130, so as to form an MOSFET (Metal-Oxide-Semiconductor Field-Effect Transistor). Further, the drain region is electrically connected to the bitline, a memory capacitor is formed above the source region, and a lower plate of the memory capacitor is electrically connected to the source region through polysilicon, so as to form a semiconductor memory. For example, a dynamic random access memory (DRAM) may be formed, and certainly, other types of memories may also be formed. In one embodiment, the memory capacitor is formed above the isolation structure 400. After the isolation structure 400 is formed, a step of etching the isolation structure 400 and forming a contact hole in the isolation structure is further included, and the lower plate of the memory capacitor is electrically connected to the source region in the substrate 100 through the contact hole and the second conductive structure.

According to the formation method for the air spacer layer 311, firstly, the first structure 200 is formed on the substrate 100, the second structure 300 is formed on the side surface of the first structure 200,the first trench 310 is formed between the second structure 300 and the first structure 200, and the side surface of the second structure 300 is exposed in the first trench 310, wherein the first structure 200 and the second structure 300 are structures required to be electrically isolated through the air spacer layer 311, and the second structure 300 is structure capable of epitaxial growth. Then, an epitaxial layer is grown, by an epitaxial growth process, from the second structure 300 exposed in the first trench 310 to the first structure 200, the first trench 310 is gradually filled with the epitaxial layer, and a trench width of the first trench 310 is gradually reduced. The time of epitaxial growth is controlled. When the epitaxial layer reaches a certain thickness, the epitaxial growth stops, and the first trench 310 is not filled up by the epitaxial layer. The first trench 310 not filled with the epitaxial layer forms the air spacer layer 311. In the formation method for the air spacer layer 311 according to the present application, the first trench 310 is formed first, and then the trench width of the first trench 310 is reduced by epitaxial growth, to form the air spacer layer 311. Therefore, the trench width of the first trench 310 is greater than a width of the air spacer layer 311. Although the width of the air spacer layer 311 is small, the trench width of the first trench 310 may be relatively large. Compared with the formation of the air spacer layer 311 by directly etching a sacrificial layer with a narrow width in the convention art, in the present application, the first trench 310 with a large width is formed first and then a width of the first trench 310 is reduced through an epitaxial layer, which can avoid the technical problem of difficult removal and non-uniform etching due to a too narrow sacrificial layer in the conventional art. At the same time, the first trench 310 with a large width is provided first, then an epitaxial layer is grown on a sidewall of the first trench 310, and the air spacer layer 311 with different widths can be obtained by controlling the thickness of the epitaxial layer.

The present application further relates to a semiconductor structure. As shown in FIG. 10a and FIG. 10b, the semiconductor structure includes:

a substrate 100;

a plurality of first structures 200 spaced on the substrate 100 in parallel, wherein the first structure 200 includes a conductive structure 210 and an isolation sidewall 230 located on each of two sides of the conductive structure 210;

a second structure 300 formed on the substrate 100 and located between adjacent first structures 200, a first trench being formed between the first structure 200 and the second structure 300, wherein the second structure 300 is made of polysilicon; and an epitaxial layer 320 grown by the second structure 300 and the substrate 100 by epitaxial growth, the epitaxial layer 320 being formed at a bottom of the first trench and a side surface of the second structure 300 toward the first trench, and an unfilled portion of the first trench forming an air spacer layer 311. Specifically, the substrate 100 is divided into a plurality of active regions 120 by a trench isolation structure 110, and the epitaxial layer grown in the substrate 100 is actually the epitaxial layer grown in the active region 120 of the substrate 100.

In one embodiment, the semiconductor structure is a dynamic random access memory (DRAM). The conductive structure 210 includes a bitline 212 extending along a first direction and a bitline protection structure 220 located above the bitline 212. In one embodiment, as shown in FIG. 11, a buried wordline 130 and a wordline protection structure 140 superposed on the buried wordline 130 are formed in the substrate 100, the buried wordline 130 and the wordline protection structure 140 extend along a second direction Y, the second direction Y is different from the first direction X, a second trench vertically penetrating the second structure 300 and exposing the wordline protection structure 140 are further formed in the second structure 300, the second trench penetrates the second structure 300 along the second direction Y, the second trench is filled with an isolation structure 400, and the isolation structure 400 covers the first structure 200, the second structure 300 and the air spacer layer 311.

In one embodiment, a source region and a drain region are formed in an active region 120 on two sides of the buried wordline 130, so as to form an MOSFET (Metal-Oxide-Semiconductor Field-Effect Transistor). Further, the drain region is electrically connected to the bitline through a bitline plug, a memory capacitor is formed above the source region, and a lower plate of the memory capacitor is electrically connected to the source region through polysilicon, so as to form a semiconductor memory. For example, a dynamic random access memory (DRAM) may be formed, and certainly, other types of memories may also be formed. In one embodiment, the memory capacitor is formed above the isolation structure 400, a contact hole is formed in the isolation structure is further included, and the lower plate of the memory capacitor is electrically connected to the source region in the substrate 100 through the contact hole and the second conductive structure 200.

According to the semiconductor structure, the first trench is formed between the first structure 200 and the second structure 300, part of the first trench is filled with the epitaxial layer 320 grown from the second structure 300 and the substrate 100, and the first trench 320 not filled with the epitaxial layer forms the air spacer layer. Since the thickness of the epitaxial layer 320 is easy to control, the width of the air spacer layer 320 can be set flexibly by adjusting the thickness of the epitaxial layer, so as to obtain the air spacer layer with a narrower width, thereby providing integration of a device. At the same time, compared with the structure "dielectric layer-air spacer layer-dielectric layer" in the conventional art, that is, the structure in which two sides of the air spacer layer are each provided with a dielectric layer, in the present application, the second structure 300 on one side of the air spacer layer is made of a material capable of epitaxial growth, and the dielectric layer is omitted between the second structure 300 and the air spacer layer, which can further reduce a size of the device and improve the integration of the device.

The above embodiments only describe several implementations of the present application, and their description is specific and detailed, but cannot therefore be understood as a limitation on the patent scope of the present invention. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:
1. A formation method for an air spacer layer, comprising:
  forming a plurality of parallel spaced first structures on a substrate;
  forming a second structure on the substrate, the second structure being located between adjacent first structures of the plurality of parallel spaced first structures, and a first trench being formed between the second structure and one of the adjacent first structures; and
  growing an epitaxial layer on a surface of the second structure by an epitaxial growth process, and filling part of the first trench with the epitaxial layer, an unfilled portion of the first trench forming the air spacer layer, wherein the second structure is made of polysilicon, and growing the epitaxial layer on the surface of the second structure by the epitaxial growth process comprises: filling doping gas during the epitaxial growth process to form a doped epitaxial layer.
2. The method according to claim 1, wherein each of the plurality of parallel spaced first structures comprises a conductive structure and an isolation sidewall located on each of two sides of the conductive structure.

3. The method according to claim 2, wherein the conductive structure comprises a bitline extending along a first direction, and a bitline protection structure is formed on the bitline.
4. The method according to claim 3, wherein a buried wordline and a wordline protection structure superposed on the buried wordline are formed in the substrate, the buried wordline and the wordline protection structure extend along a second direction, the second direction is different from the first direction, and after the air spacer layer is formed, the method further comprises:
  etching the second structure to form a second trench exposing the wordline protection structure, the second trench penetrating the second structure along the second direction; and
  depositing an isolation structure, the isolation structure filling the second trench and covering the one of the adjacent first structures, the second structure and the air spacer layer.
5. The method according to claim 1, wherein each of the plurality of parallel spaced first structures comprises a conductive structure and isolation sidewall located on a side surface of the conductive structure, and forming the plurality of parallel spaced first structures on the substrate comprises:
  forming a plurality of parallel spaced conductive structures on the substrate;
  forming an isolation layer on exposed surfaces of the conductive structure and the substrate by a deposition process; and
  etching back the isolation layer, removing the isolation layer on top surfaces of the substrate and the conductive structure, and retaining the isolation layer on the side surface of the conductive structure, to form the isolation sidewall.
6. The method according to claim 5, wherein the deposition process comprises an atomic layer deposition process.
7. The method according to claim 1, wherein forming the second structure on the substrate, the second structure being located between the adjacent first structures of the plurality of parallel spaced first structures, and the first trench being formed between the second structure and the one of the adjacent first structures comprises:
  depositing, on the substrate, a gap filling layer covering the one of the adjacent first structures and the substrate on two sides of the one of the adjacent first structures;
  removing the gap filling layer above the one of the adjacent first structures by a polishing process, so that a top surface of the gap filling layer is flush with a top surface of the one of the adjacent first structures; and
  etching part of the gap filling layer to form the second structure, and forming the first trench between the one of the adjacent first structures and the second structure.
8. The method according to claim 1, wherein the first trench has a width ranging from 1 nm to 20 nm, and the epitaxial layer has a thickness ranging from 1 nm to 15 nm.
9. The method according to claim 1, wherein the growing the epitaxial layer on the surface of the second structure by the epitaxial growth process comprises:
  growing the epitaxial layer simultaneously on a top surface of the second structure and on a side surface of the second structure toward the first trench by the epitaxial growth process, and enabling the epitaxial layer grown at a top corner of the second structure to seal the first trench; and
  removing the epitaxial layer above the one of the adjacent first structures by a polishing process.

10. The method according to claim 1, wherein the substrate comprises an active region, and growing the epitaxial layer on the surface of the second structure by the epitaxial growth process further comprises:

growing the epitaxial layer on a surface of the active region of the substrate by the epitaxial growth process.

11. A semiconductor structure, comprising:

a substrate;

a plurality of first structures spaced on the substrate in parallel;

a second structure formed on the substrate and located between adjacent first structures of the plurality of first structures, a first trench being formed between the second structure and one of the adjacent first structures; and an epitaxial layer grown by the second structure and the substrate by epitaxial growth, the epitaxial layer being formed at a bottom of the first trench and a side surface of the second structure toward the first trench, and an unfilled portion of the first trench forming an air spacer layer, wherein the second structure is made of polysilicon.

12. The semiconductor structure according to claim 11, wherein each of the plurality of first structures comprises a conductive structure and an isolation sidewall located on each of two sides of the conductive structure.

13. The semiconductor structure according to claim 12, wherein the semiconductor structure is a dynamic random access memory, the conductive structure comprises a bitline extending along a first direction, and a bitline protection structure is formed on the bitline.

14. The semiconductor structure according to claim 13, wherein a buried wordline and a wordline protection structure superposed on the buried wordline are formed in the substrate, the buried wordline and the wordline protection structure extend along a second direction, the second direction is different from the first direction, a second trench vertically penetrating the second structure and exposing the wordline protection structure are further formed in the second structure, the second trench penetrates the second structure along the second direction, the second trench is filled with an isolation structure, and the isolation structure covers the one of the adjacent first structures, the second structure and the air spacer layer.

15. A semiconductor structure, comprising:

a substrate;

a plurality of first structures spaced on the substrate in parallel;

a second structure formed on the substrate and located between adjacent first structures of the plurality of first structures, a first trench being formed between the second structure and one of the adjacent first structures; and an epitaxial layer grown by the second structure and the substrate by epitaxial growth, the epitaxial layer being formed at a bottom of the first trench and a side surface of the second structure toward the first trench, and an unfilled portion of the first trench forming an air spacer layer;

wherein each of the plurality of first structures comprises a conductive structure and an isolation sidewall located on each of two sides of the conductive structure;

wherein the semiconductor structure is a dynamic random access memory, the conductive structure comprises a bitline extending along a first direction, and a bitline protection structure is formed on the bitline.

16. The semiconductor structure according to claim 15, wherein a buried wordline and a wordline protection structure superposed on the buried wordline are formed in the substrate, the buried wordline and the wordline protection structure extend along a second direction, the second direction is different from the first direction, a second trench vertically penetrating the second structure and exposing the wordline protection structure are further formed in the second structure, the second trench penetrates the second structure along the second direction, the second trench is filled with an isolation structure, and the isolation structure covers the one of the adjacent first structures, the second structure and the air spacer layer.

\* \* \* \* \*